(12) United States Patent  (10) Patent No.: US 6,727,525 B1
Goerlach  (45) Date of Patent: Apr. 27, 2004

(54) DIODE COMPRISING A METAL SEMICONDUCTOR CONTACT AND A METHOD FOR THE PRODUCTION THEREOF

(75) Inventor: Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 7 days.

(21) Appl. No.: 10/030,309

(22) PCT Filed: Jun. 3, 2000

(86) PCT No.: PCT/DE00/01812

§ 371 (c)(1),
(2), (4) Date: May 13, 2002

(87) PCT Pub. No.: WO01/03204

PCT Pub. Date: Jan. 11, 2001

(30) Foreign Application Priority Data

Jul. 3, 1999 (DE) .......................... 199 30 781

(51) Int. Cl.[7] .................. H01L 29/74; H01L 31/111
(52) U.S. Cl. ........................................ 257/107
(58) Field of Search ................ 257/109, 110, 257/111, 112, 155, 156, 107, 497, 498, 482, 481, 483, 471, 472, 453, 473

(56) References Cited

U.S. PATENT DOCUMENTS 3,739,243 A * 6/1973 Semichon et al. .......... 317/235
4,200,877 A * 4/1980 Suzuki et al. ............... 357/13

FOREIGN PATENT DOCUMENTS

| DE | 27 33 840   | 2/1978  |
| DE | 197 05 728  | 8/1998  |
| EP | 0 275 179   | 7/1988  |
| JP | 60-84878    | 5/1985  |
| JP | 08264811    | 10/1996 |
| WO | WO 99/12188 | 3/1999  |

OTHER PUBLICATIONS

Patent Abstracts of Japan, vol. 009, No. 230 (E–343), Sep. 17, 1985.

K. J. Schoen et al., "High Voltage GaInP/GaAs Dual Material Schottky Rectifiers," Appl. Phys. Lett. vol. 71, No. 4, pp. 518 to 520, Jul. 28, 1997.

* cited by examiner

*Primary Examiner*—Long Pham
*Assistant Examiner*—Dana Farahani
(74) *Attorney, Agent, or Firm*—Kenyon & Kenyon

(57) ABSTRACT

A diode includes a semiconductor substrate that is arranged between two metallic electrodes, having a strongly doped first zone that forms an ohmic transition to the first electrode, a weakly doped second zone, having the same conductivity type, that forms a rectifying transition to the second electrode, and a third zone that, having the same conductivity type, is doped more weakly than the second zone. The third zone separates the first and the second zones from one another, and the second zone is enclosed between the second electrode and the third zone.

4 Claims, 2 Drawing Sheets

DIODE COMPRISING A METAL SEMICONDUCTOR CONTACT AND A METHOD FOR THE PRODUCTION THEREOF

FIELD OF THE INVENTION

The present invention relates to a diode having a semiconductor substrate that is situated between two metallic electrodes and that is strongly doped in a first zone in order to form an ohmic transition to the first electrode, and is weakly doped in a second zone having the same conductivity type in order to form a rectifying transition to the second electrode.

BACKGROUND INFORMATION

Semiconductor diodes of this type, also known as Schottky diodes, are conventional. They are distinguished by a small voltage drop in the conducting direction and a short turn-off time, because, in contrast to pn diodes or pin diodes, no minority charge carriers need be discharged in order to stop a flow of current.

FIG. 4 illustrates a simple example embodiment of such a diode. Above a strongly doped zone 3 is arranegd a more weakly doped zone 1. A thin metal layer, made, for example, of aluminum, is applied to each of the two zones. The metal layer on the lower side of the substrate forms a first electrode 6, which is in ohmic contact with zone 3 of the semiconductor substrate arranged above it. The metal layer on the upper side of the semiconductor constitutes a second electrode 5 which forms, together with zone 1, a metal semiconductor contact having a diode characteristic. First electrode 6 represents the cathode, and second electrode 5 represents the anode of the diode.

If such a component is operated in the reverse direction, then, at a certain boundary voltage, a sharp increase in the reverse current occurs as a result of avalanche multiplication, analogously to a one-sided abrupt pn transition. However, the boundary voltages, at which such an increase in the current occurs, are mostly significantly smaller than would be expected proportionately to the selected doping of zone 1. The deviation is typically of a factor of 3. The reason for this is that a rise in field strength occurs at the edges of electrodes 5, 6. For this reason, the avalanche multiplication begins at the edge of the component. The result is that diodes having the configuration illustrated in FIG. 4 exhibit high reverse currents already below the breakdown voltage. In the case of an avalanche breakdown, high power losses occur at the diode edge, because the overall breakdown current is concentrated at this region. For this reason, diodes having the simple configuration illustrated in FIG. 4 are not suitable for use as elements for limiting voltage.

A conventional solution to this problem is the configuration illustrated in FIG. 5. This configuration is described, for example, in B. J. Baliga, Power Semiconductor Devices, PWS Publishing Company, Boston, U.S., 1995. An annular, circumferential p-doped layer 7 is additionally introduced into n-doped zone 1. In accordance with steps that are standard in planar technology, anode 5 is fashioned so that, on the one hand, it is contacted with n-doped second zone 1 and with p-doped layer 7, and that, on the other hand, the outer edge of anode 5 comes to rest on an oxide layer 8 on the surface of the semiconductor substrate. The circumferential p-doped layer 7 is called a guard ring. In this manner, a reduction in the edge field strength is achieved. The avalanche breakdown now no longer occurs at the edge, but rather is distributed in a uniform manner over the surface of second zone 1 inside guard ring 7. Because no local breakdowns occur at the edge at voltages below the desired breakdown boundary voltage, a Schottky diode having a guard ring can be used for voltage limitation.

The manufacture of such a diode is, however, associated with an increased expense. Thus, on the one hand, the manufacture of a flat, weakly doped zone such as zone 1 over a more strongly doped zone, such as zone 3, is expensive, because, in general, an epitaxial method must be used for this purpose. Subsequently, guard ring 7 must be structured and put in place, and oxide layer 8 must be structured, in order finally to enable anode 5 to be deposited thereupon in the desired form.

SUMMARY

In accordance with the present intention, a diode of the type indicated above is created that is suitable for use as a voltage limiter and may be manufactured easily and economically. These advantages are achieved due to the fact that, in the diode according to the present invention, the first and second zone are separated by a third zone of the semiconductor substrate, this third zone, having the same conductivity type as the two others, being doped more weakly than the second zone.

Through suitable choice of the dimensions and doping concentrations of the individual zones, it may be ensured that the breakdown voltage at the transition from the second electrode to the third zone is greater than to the more strongly doped second zone. As a result, when the breakdown voltage of this second zone is achieved, the edge field strength at an edge of the second electrode touching the third zone is smaller than in its region touching the second zone, so that an avalanche breakdown occurs only in the second zone.

The conventional guard ring, and the process steps required for its manufacture, may therefore be omitted. Since the diode requires only zones having the same conductivity type, a single doping agent is sufficient.

The dimensions and the dopings of the zones may be selected such that the (calculated) breakdown voltage in a contact region between the second electrode and the third zone is at least three times as great as that between the second electrode and the second zone.

According to a first example embodiment of the present invention, the second zone is raised over the surface of the third zone, and the second electrode covers the second zone in a hat shape, and has a surrounding rim that touches the second zone. Such a diode may be produced, for example, using a manufacturing process where, first, the second zone is produced on the overall surface of the third zone of the semiconductor substrate and is subsequently eroded locally, in order to expose the surface of the third zone locally.

This local erosion may include a sawing using a circular saw, or also a masking and etching method.

According to a second example embodiment of the present invention, the surface of the diode may also be planar, and the second zone may be embedded into the third zone in the manner of islands, and the second electrode is flat and touches the third zone in an edge region. Such a diode may be produced, for example, through the island-by-island application of a doping agent onto the surface of the semiconductor substrate, doped with the concentration of the third zone, and diffusing in of the doping agent.

In order to improve the contact between the electrodes and the semiconductor substrate, at least one of the electrodes may be applied to an oxide-free surface of the semiconductor substrate. In order to remove the oxide that is naturally present on a semiconductor crystal, a treatment of the surface through sputtering, through heating in an ultrahigh vacuum, or through suitable etching is possible. A sputter treatment, for example using argon ions, is in particular simple and useful if the electrodes are subsequently also to be produced through the sputtering of metal onto the semiconductor substrate.

Additional features and advantages of the invention are derived from the following description of example embodiments, with reference to the Figures.

DETAILED DESCRIPTION

Figure 1:
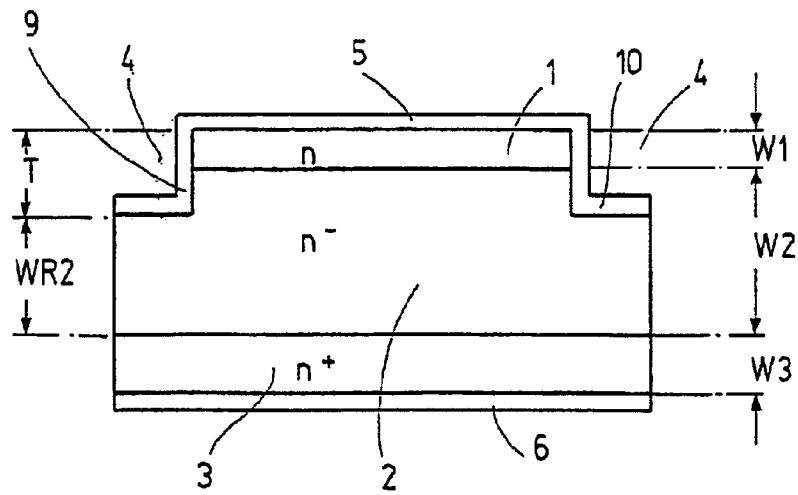
FIG. 1 is a cross-sectional view of the structure of an example embodiment of a diode according to the present invention.

In FIG. 1, a diode according to the present invention is illustrated schematically in cross-section. A weakly doped (n$^-$) third semiconductor zone (as it is called) 2, having width W2, is arranged above a strongly n-doped (n$^+$) first semiconductor zone (as it is called) 3, having width W3. W3 may be smaller than W2. From the manufacturing standpoint, this arrangement may be advantageous because it enables the production of the first zone through the diffusing in of doping atoms from the surfaces into an n$^-$doped substrate, whereas the production of a weakly doped thin layer on a more strongly doped base may require the use of expensive epitaxial methods.

Located above zone 2 is a second zone (as it is called) 1 that is n-doped with medium strength (n), having width W1. Together with the thin metal layer of the anode 5, this zone represents the actual Schottky contact of the diode illustrated. Zone 1 is configured in its width and doping so that a desired reverse voltage UZ is achieved.

At all edges of the substrate, a recess 4 having depth T is cut in. This recess crosses second zone 1 and extends up to the weakly n-doped third zone 2. Anode 5 extends, in the shape a of a hat, over the entire surface of zone 1 and its vertical lateral edges 9 in the region of recesses 4. The surface of third zone 2 exposed in recesses 4 is covered by rim 10 of the hat.

A metallization layer on the underside of second zone 3 forms a cathode 6 of the diode.

Width WR2, which is reduced in the area of recesses 4, and the doping of the weakly n-doped third zone 2, are selected such that a breakdown voltage UZR results for the direct transition between anode 5 and third zone 2 that is at least three times as large as breakdown voltage UZ of anode 5 to second zone 1. For this reason, as explained above, the field strength in the edge region, i.e., at rim 10 and in the area of lateral edges 9, is smaller than in the center of the anode, and the avalanche breakdown remains limited to second zone 1.

Since, moreover, in contrast to the case of a pn diode, the essential portion of the reverse current of a Schottky diode is determined by the barrier height (thermionic current), and, moreover, the barrier height depends on the reverse voltage (reduction of the barrier as a result of mirror charges), the reverse current at the edge of anode 5 at the transition to third zone 2 is, in fact, smaller than in the center region at second zone 1.

The diode illustrated in FIG. 1 may be manufactured in the following manner. Beginning with a homogenous n$^-$-doped semiconductor substrate, doping atoms are introduced into the layers of the substrate close to the surface. This introduction may, for example, occur through the occupation of the surfaces with the doping atoms and subsequent diffusing in, through which a concentration distribution having a Gauss profile is obtained, or else may occur through ion implantation. In this manner, one obtains a semiconductor substrate having two doped-on surface zones that correspond to the later zones 1 to 3 of the finished diode, and a center zone having an unchanged doping concentration corresponding to third zone 2.

In a subsequent step, the more weakly doped of the two surface zones is eroded locally until the third zone, the doping concentration of which has remained unchanged, is exposed. This local erosion may be performed, for example, with the aid of a circular saw, with which a multiplicity of grooves are cut into the surface of the substrate, between which island-type raised areas having a high degree of doping remain.

In order to improve the characteristics of the Schottky contact to be applied to this surface, an etching onto the semiconductor surface may follow the sawing. In this manner, the surface disturbed in its crystal structure by the sawing is eroded, and regions of the crystal that are located thereunder and that have remained undamaged are exposed.

The production of the recesses may also be effected using other methods, such as wet-chemical etching or gas-phase etching, with the use of a corresponding masking technique.

Before the depositing of electrodes 5 to 6, in addition, a suitable surface treatment of the substrate, for example etching in hydrofluoric acid (HF) or heating in an ultrahigh vacuum, may be performed, in order to remove the oxide that is always naturally present on the substrate surface, and thus to create better surface characteristics for the Schottky contact.

Subsequently, the substrate is provided on both surfaces with a metal layer. For this purpose, a sputtering method may be used, because this allows a sputtering on, before the metal depositing, of the natural oxide layer in situ, for example using argon ions. Once the metal layers are deposited, the substrate is diced into individual components in the usual manner. For this purpose, as for the local erosion, a circular saw may be used, with which the substrate is cut apart in the center of each of the previously sawed-in recesses (dicing). The saw blade for dicing the substrate is significantly if narrower than the saw blade used for sawing in recesses 4. Once the substrate is diced, one obtains the structure illustrated in cross-section in FIG. 1.

As a concrete numerical example, the manufacture of a Schottky diode from silicon, having a limitation voltage of 48 volts, shall be considered. In a substrate having a homogenous doping of $1.8 \times 10^{15}/cm^3$ and a wafer thickness W1+W2+W3 of 120 μm, the doping materials are introduced into zones 1 (front side) and 3 (back side) by occupation and diffusion. In this manner, Gauss-shaped doping profiles are obtained in zones 1 and 3. For n-doped second zone 1, a surface concentration of $1.075 \times 10^{16}/cm^3$ is selected, and for the n+-doped first zone 3, a surface concentration of $1 \times 10^{20}/cm^3$ is selected. In both cases, the diffusion length is 17 μm. Depth T of recess 4, which completely surrounds second zone 1, is 35 μm. The width of recess 4 before the sectioning of the individual components is approximately 100 μm. Electrodes 5 and 6 are each made of a solderable layer system having layers of Cr, NiV, and Ag, having respective layer thicknesses of approximately 80, 150, and 80 nanometers. In the separation of the diodes from one another, a narrow saw blade, having, for example, a width of 40 μm, is used, so that recess 4 and the surface of third zone 2 exposed therein and covered with metal remain present.

Figure 2:
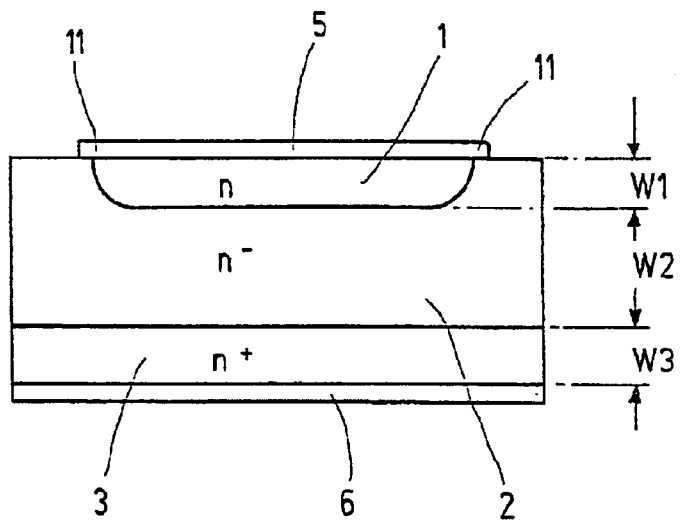
FIG. 2 is a cross-sectional view of the structure of another example embodiment of a diode according to the present invention.

A surface on which island-type second zones 1 are separated by intervening regions of third zone 2 may also be achieved through a planar structuring. An example embodiment is illustrated in FIG. 2. Here, n-doped second zone 1 and n⁻-doped third zone 2 have a common flat surface on which anode 5 covers the entire second zone 1 and, in its edge regions 11, a part of the surface of third zone 2. The manner of operation of this construction is the same as that illustrated in FIG. 1. The doping profiles for zones 1 and 3 may be selected, as described above in connection with FIG. 1. The width of the weakly doped zone may even be selected somewhat smaller (for a breakdown voltage UZ of 48 volts, W1+W2 must be greater than 8 μm). It is important that anode 5 extend beyond the lateral diffusing out of second zone 1 in all directions, so that edge regions 11 form a ring that completely surrounds second zone 1 on the surface of third zone 2.

Figure 3:
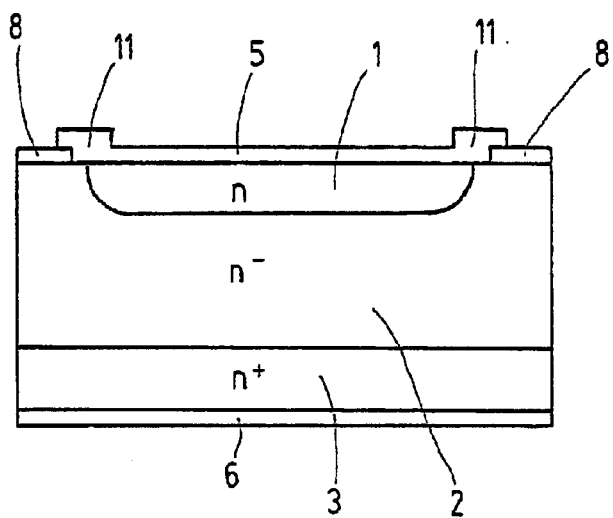
FIG. 3 is a cross-sectional view of the structure of a further example embodiment of a diode according to the present invention.
Figure 4:
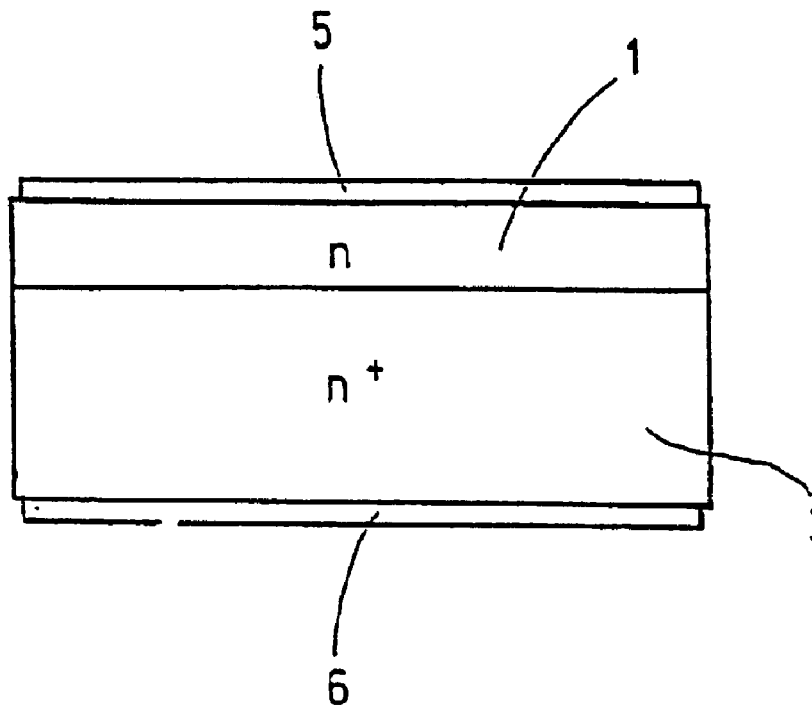
FIG. 4 is a cross-sectional view a Schottky diode.
Figure 5:
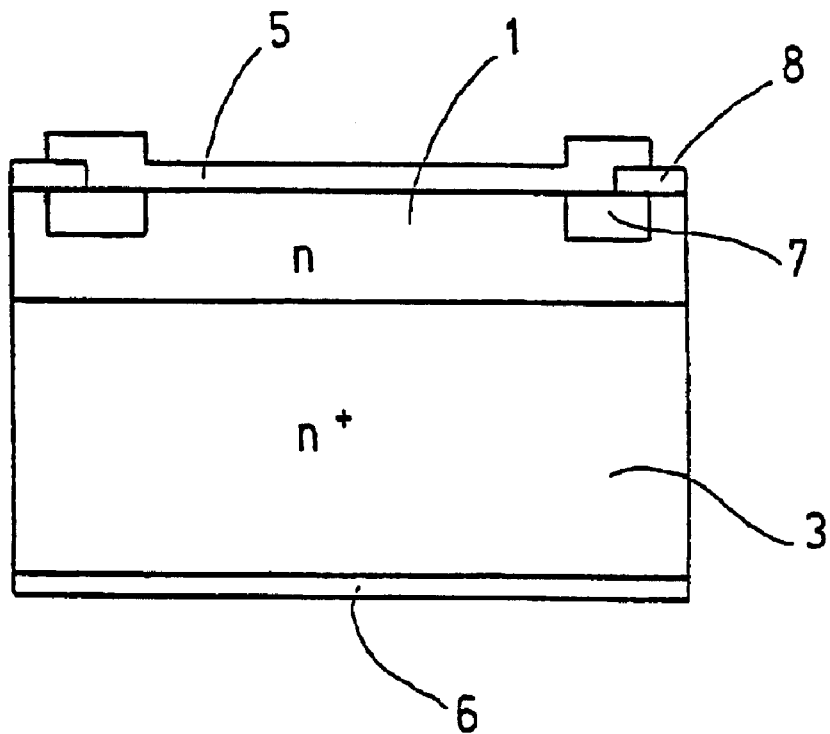
FIG. 5 is a cross-sectional view of another Schottky diode.

A third example embodiment of a Schottky diode according to the present invention is illustrated in FIG. 3. It largely corresponds to the arrangement illustrated in FIG. 2. In addition, another insulating layer 8, made, for example, of $SiO_2$, is present on the edge of the semiconductor substrate onto which the edge of anode 5 extends. For this reason, in this construction, in addition to the field strength reduction due to the high-ohmic third zone 2, at the edge there is also the effect of a magnetoresistor.

The diodes and manufacturing methods described herein, in particular those illustrated in FIG. 1, are suitable for the manufacture of diodes using silicon, but in particular also using silicon carbide, as a semiconductor material. SiC diodes of this sort are of particular interest for use at high temperatures and high voltages (>50 volts). At such voltages, conventional diodes made of silicon may be used only with difficulty due to their high reverse currents and reverse losses. Here, silicon carbide is more suitable as a semiconductor material due to its low diffusion coefficients of doping atoms. However, at the same time, these low diffusion coefficients make the processing of this material more difficult, because they complicate or prevent a doping through application of a doping agent onto the surface of the semiconductor substrate and diffusing in thereof. For this reason, for the manufacture of a Schottky diode from silicon carbide having the structure illustrated in FIG. 1, zones 2 and 1 are deposited on an SiC substrate epitaxially. The production of recesses 4 may occur, for example, by dry etching on the basis of gases containing fluorine.

What is claimed is:

1. A diode, comprising:
a semiconductor substrate arranged between a first metallic electrode and a second metallic electrode, the substrate highly doped in a first zone to form an ohmic transition to the first electrode and weakly doped in a second zone to form a rectifying transition to the second electrode:
wherein the first zone and the second zone are separated by a third zone of the semiconductor substrate doped more weakly than the second zone, the first zone, the second zone and the third zone having a same conductivity type, the second zone enclosed between the second electrode and the third zone; and
wherein a breakdown voltage between the second electrode and the third zone is at least three times as great as a breakdown voltage between the second electrode and the second zone.

2. A diode, comprising:
a semiconductor substrate arranged between a first metallic electrode and a second metallic electrode, the substrate highly doped in a first zone to form an ohmic transition to the first electrode and weakly doped in a second zone to form a rectifying transition to the second electrode;
wherein the first zone and the second zone are separated by a third zone of the semiconductor substrate doped more weakly than the second zone, the first zone, the second zone and the third zone having a same conductivity type, the second zone enclosed between the second electrode and the third zone; and
wherein the second zone is raised over a surface of the third zone, and the second electrode covers the second zone in a hat shape that includes a circumferential rim that touches the third zone.

3. A diode, comprising:
a semiconductor substrate arranged between a first metallic electrode and a second metallic electrode, the substrate highly doped in a first zone to form an ohmic transition to the first electrode and weakly doped in a second zone to form a rectifying transition to the second electrode;
wherein the first zone and the second zone are separated by a third zone of the semiconductor substrate doped more weakly than the second zone, the first zone, the second zone and the third zone having a same conductivity type, the second zone enclosed between the second electrode and the third zone; and
wherein the second zone is planar and island-type on a surface of the third zone, and the second electrode is flat and touches the third zone in an edge region.

4. A diode, comprising:
a semiconductor substrate arranged between a first metallic electrode and a second metallic electrode, the substrate highly doped in a first zone to form an ohmic transition to the first electrode and weakly doped in a second zone to form a rectifying transition to the second electrode, the first zone and the second zone separated by a third zone of the semiconductor substrate doped more weakly than the second zone, the first zone, the second zone and the third zone having a same conductivity type, the second zone enclosed between the second electrode and the third zone; and
an insulating layer formed on a surface of the third zone surrounding the second zone, the edge of the second electrode touching the Insulating layer.

* * * * *

UNITED STATES PATENT AND TRADEMARK OFFICE
CERTIFICATE OF CORRECTION

PATENT NO. : 6,727,525 B1
DATED : April 27, 2004
INVENTOR(S) : Alfred Goerlach

It is certified that error appears in the above-identified patent and that said Letters Patent is hereby corrected as shown below:

Column 1,
Lines 17-18, change "known as Schot-tky diodes" to -- known as Schott-key diodes --

Column 4,
Line 57, change "significantly if narrower" to -- significantly narrower --

Signed and Sealed this

Seventh Day of June, 2005

JON W. DUDAS
*Director of the United States Patent and Trademark Office*